(12) United States Patent
Otani et al.

(10) Patent No.: US 11,709,430 B2
(45) Date of Patent: Jul. 25, 2023

(54) METHOD FOR MANUFACTURING CURED PRODUCT PATTERN, METHOD FOR MANUFACTURING PROCESSED SUBSTRATE, METHOD FOR MANUFACTURING CIRCUIT BOARD, METHOD FOR MANUFACTURING ELECTRONIC COMPONENT, AND METHOD FOR MANUFACTURING IMPRINT MOLD

(71) Applicant: CANON KABUSHIKI KAISHA, Tokyo (JP)

(72) Inventors: Tomonori Otani, Fukui (JP); Toshiki Ito, Kawasaki (JP); Tomohiro Saito, Utsunomiya (JP); Kouhei Nagane, Yokohama (JP); Kenichi Ueyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 372 days.

(21) Appl. No.: 16/899,367

(22) Filed: Jun. 11, 2020

(65) Prior Publication Data
US 2020/0298452 A1    Sep. 24, 2020

Related U.S. Application Data

(63) Continuation of application No. PCT/JP2018/044660, filed on Dec. 5, 2018.

(30) Foreign Application Priority Data

Dec. 14, 2017    (JP) .............................. 2017-239951

(51) Int. Cl.
*G03F 7/20* (2006.01)
*B29C 33/38* (2006.01)
(Continued)

(52) U.S. Cl.
CPC ........ *G03F 7/2012* (2013.01); *B29C 33/3842* (2013.01); *B29C 33/424* (2013.01);
(Continued)

(58) Field of Classification Search
CPC ........ G03F 7/2012; G03F 7/0002; G03F 7/11; G03F 7/161; G03F 7/0015;
(Continued)

(56) References Cited

U.S. PATENT DOCUMENTS 6,936,194 B2    8/2005    Watts
9,147,687 B2    9/2015    Koh et al.
(Continued)

FOREIGN PATENT DOCUMENTS

JP    H11-160510 A    6/1999
JP    2011-508686 A    3/2011
(Continued)

OTHER PUBLICATIONS

International Preliminary Report on Patentability of PCT/JP2018/044660 dated Jun. 16, 2020.

*Primary Examiner* — Caleen O Sullivan
(74) *Attorney, Agent, or Firm* — Canon U.S.A., Inc. IP Division

(57) ABSTRACT

A method for manufacturing a cured product pattern of a curable composition includes the steps of, in sequence, depositing a droplet of the curable composition onto a substrate; bringing a mold having an uneven pattern formed in a surface thereof into contact with the curable composition; curing the curable composition; and releasing a cured product of the curable composition from the mold. The mold has a recess having a bottom surface and a stair structure arranged to form an opening surface that becomes wider from the bottom surface toward the surface of the mold. In the contact step, the curable composition comes into contact
(Continued)

with the stair portion after a top of the droplet comes into contact with the bottom surface.

17 Claims, 7 Drawing Sheets

(51) Int. Cl.
*B29C 33/42* (2006.01)
*G03F 7/00* (2006.01)
*G03F 7/11* (2006.01)
*G03F 7/16* (2006.01)
*H10B 41/20* (2023.01)
*H10B 41/35* (2023.01)
*H10B 43/10* (2023.01)
*H10B 43/20* (2023.01)
*H10B 43/35* (2023.01)
*H10B 41/10* (2023.01)

(52) U.S. Cl.
CPC .............. *G03F 7/0002* (2013.01); *G03F 7/11* (2013.01); *G03F 7/161* (2013.01); *H10B 41/10* (2023.02); *H10B 41/20* (2023.02); *H10B 41/35* (2023.02); *H10B 43/10* (2023.02); *H10B 43/20* (2023.02); *H10B 43/35* (2023.02)

(58) Field of Classification Search
CPC ... B29C 33/3842; B29C 33/424; B29C 33/42; B29C 33/38; B29C 59/02; H01L 27/11519; H01L 27/11524; H01L 27/11551; H01L 27/11565; H01L 27/1157; H01L 27/11578; H01L 27/11575; H01L 21/027; H10B 41/10; H10B 41/20; H10B 41/35; H10B 43/10; H10B 43/20; H10B 43/35; H10B 43/50
USPC ............ 438/702; 427/256; 118/504; 430/325
See application file for complete search history.

(56) References Cited

U.S. PATENT DOCUMENTS

| | | | |
|---|---|---|---|
| 2004/0046271 | A1 | 3/2004 | Watts |
| 2010/0104984 | A1* | 4/2010 | Shiobara ................ B82Y 10/00 430/319 |
| 2011/0177459 | A1* | 7/2011 | Ogihara ............ H01L 21/31144 977/734 |
| 2016/0129612 | A1 | 5/2016 | Seki et al. |
| 2017/0287708 | A1* | 10/2017 | Liu ..................... H01L 21/0273 |

FOREIGN PATENT DOCUMENTS

| | | |
|---|---|---|
| JP | 2013-202982 A | 10/2013 |
| JP | 6141500 B2 | 6/2017 |
| JP | 2017179458 A | 10/2017 |
| JP | 2018-085491 A | 5/2018 |
| JP | 2018-098274 A | 6/2018 |
| JP | 2018-125377 A | 8/2018 |
| JP | 2018-157093 A | 10/2018 |

* cited by examiner

METHOD FOR MANUFACTURING CURED PRODUCT PATTERN, METHOD FOR MANUFACTURING PROCESSED SUBSTRATE, METHOD FOR MANUFACTURING CIRCUIT BOARD, METHOD FOR MANUFACTURING ELECTRONIC COMPONENT, AND METHOD FOR MANUFACTURING IMPRINT MOLD

CROSS-REFERENCE TO RELATED APPLICATIONS

This application is a Continuation of International Patent Application No. PCT/JP2018/044660, filed Dec. 5, 2018, which claims the benefit of Japanese Patent Application No. 2017-239951, filed Dec. 14, 2017, both of which are hereby incorporated by reference herein in their entirety.

BACKGROUND OF THE INVENTION

Field of the Invention

The present invention relates to methods for manufacturing cured product patterns, methods for manufacturing processed substrates, methods for manufacturing circuit boards, methods for manufacturing electronic components, and methods for manufacturing imprint molds.

Description of the Related Art

There has been a growing need for miniaturization of semiconductor devices and other devices such as MEMS, and photo-nanoimprint technology has attracted attention as a microfabrication technology.

In photo-nanoimprint technology, a mold having a fine uneven pattern formed in a surface thereof is pressed against a photocurable composition (resist) applied to a substrate (wafer), and the photocurable composition is cured in this state. Thus, the uneven pattern of the mold is transferred to the cured film of the photocurable composition to form a pattern on the substrate. By photo-nanoimprint technology, a fine structure with a size on the order of several nanometers can be formed on a substrate.

A photo-nanoimprint technique disclosed in Japanese Patent Application Laid-Open No. 2013-202982 will now be described with reference to FIGS. 1A to 1E. First, droplets of a liquid resist 103 are discretely dispensed onto a pattern formation region of a substrate 101 by an inkjet process (deposition step, FIG. 1A). The dispensed resist droplets spread over the substrate in the plane direction of the substrate. This phenomenon is called prespread (104 in FIG. 1B indicates the direction in which the droplets spread). This resist is then molded with a mold 105 that has a pattern formed therein and that is transparent to irradiation light, described later (mold contact step, FIG. 1C). In the mold contact step, the resist droplets spread throughout the gap between the substrate and the mold by capillary action (in the horizontal direction indicated by 104 in FIG. 1C). This phenomenon is called spread. In the mold contact step, the resist also fills the insides of the recesses of the mold by capillary action (in the vertical direction indicated by 104 in FIG. 1C). This filling phenomenon is called fill. The time to completion of spread and fill is called filling time. After resist filling is completed, the resist is cured by irradiation with light (light irradiation step, FIG. 1D) and is then released (release step, FIG. 1E). By performing these steps, a cured product pattern of the resist that has a predetermined shape (photocured film, 107 in FIG. 1E) is formed on the substrate.

With the recent need for a wider variety of electronic devices with greater functionality, it has also been desired to form a particular fine 3D structure pattern on a substrate. An example of a known 3D structure is a stair structure (hereinafter referred to as "stair pattern") for 3D NAND flash memory, as shown in FIGS. 2A and 2B.

U.S. Pat. No. 9,147,687 discloses that a stair pattern is formed by a photo-nanoimprint technique in which a substrate is spin-coated with a resist. In addition, U.S. Pat. No. 6,936,194 discloses a technique in which imprint is performed by an inkjet process, as in Japanese Patent Application Laid-Open No. 2013-202982, using a mold with recesses having a stair structure.

In nanoimprint technology, the recesses of a mold are filled with a resist by capillary action; therefore, it takes considerable time for the resist to reach the deepest portions of the mold, i.e., the bottom surfaces of the recesses, even if the method in U.S. Pat. No. 6,936,194 is used.

In particular, the line width and pattern height of a stair pattern 203 for 3D NAND flash memory as shown in FIGS. 2A and 2B differ greatly from those required in conventional nanoimprint technology; that is, the lateral width 207 of the flat portion is several millimeters, the lateral width 208 of the stair portions is several tens of micrometers, and the pattern height 204 is several micrometers. To form this pattern, it is necessary to form larger recesses in a mold than in conventional molds. If this mold is used to perform nanoimprint as described above, a problem arises in that, because the capillary force acting on the resist is considerably weak, it takes an even longer time for the resist to fill the stair pattern, and in some cases, gas bubbles remain due to insufficient filling.

SUMMARY OF THE INVENTION

The present invention provides a method for manufacturing a cured product pattern in which a recess of a mold can be filled at high speed.

In view of the foregoing problem, a method for manufacturing a cured product pattern of a curable composition according to the present invention includes the steps of, in sequence: depositing a droplet of the curable composition onto a substrate; bringing a mold having an uneven pattern formed in a surface thereof into contact with the curable composition; curing the curable composition; and releasing a cured product of the curable composition from the mold, wherein the mold has a recess having a bottom surface and a stair structure arranged to form an opening that becomes wider from the bottom surface toward the surface of the mold, and in the contact step, the curable composition comes into contact with the stair structure after a top of the droplet comes into contact with the bottom surface.

According to the present invention, an imprint method is provided in which a recess of a mold can be filled at high speed and which is suitable for the manufacture of a cured product pattern.

Further features of the present invention will become apparent from the following description of exemplary embodiments with reference to the attached drawings.

DESCRIPTION OF THE EMBODIMENTS

Figure 1A:
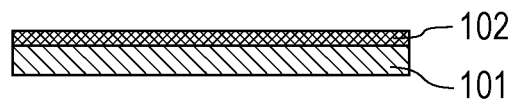
FIG. 1A is a schematic sectional view illustrating a conventional photo-nanoimprint technique.
Figure 1B:
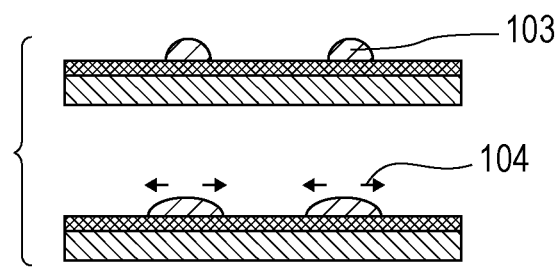
FIG. 1B includes schematic sectional views illustrating the conventional photo-nanoimprint technique.
Figure 1C:
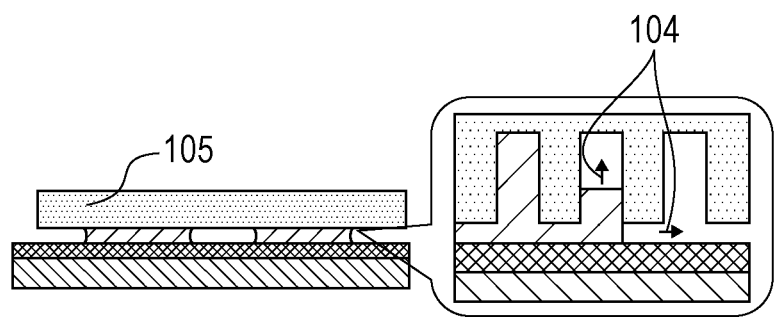
FIG. 1C is a schematic sectional view illustrating the conventional photo-nanoimprint technique.
Figure 1D:
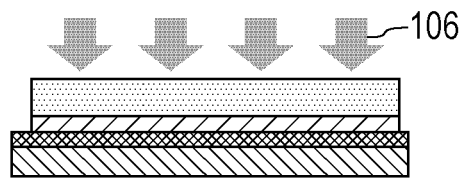
FIG. 1D is a schematic sectional view illustrating the conventional photo-nanoimprint technique.
Figure 1E:
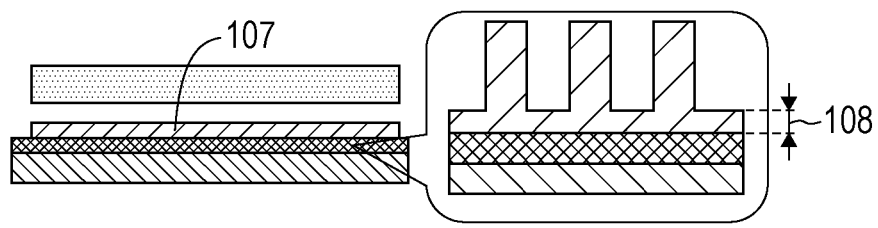
FIG. 1E is a schematic sectional view illustrating the conventional photo-nanoimprint technique.

An embodiment of the present invention will hereinafter be described in detail with reference to the drawings where appropriate. The invention, however, is not limited to the embodiment described below. In addition, suitable modifications, improvements, and the like made to the embodiment described below based on ordinary knowledge of those skilled in the art without departing from the spirit of the invention also fall within the scope of the invention. The components present in a curable composition (A) are referred to as "components (a) to (e)".

[Curable Composition]

The curable composition (A) according to the present embodiment is a compound having at least a component (a) that is a polymerizable compound. Although the curable composition according to the present embodiment may be a thermosetting composition, the curable composition is preferably a photocurable composition. As a photocurable composition, the curable composition (A) may further contain a component (b) that is a photopolymerization initiator, a component (c) that is an internal release agent, a component (d) that is another nonpolymerizable compound, and a component (e) that is a solvent.

In addition, "cured film" in the present specification refers to a film cured on a substrate by polymerizing a curable composition. There is no particular limitation as to the shape of the cured film, and the cured film may have a pattern shape in a surface thereof.

The individual components will hereinafter be described in detail.

<Component (A): Polymerizable Compound>

The component (a) is a polymerizable compound. Here, "polymerizable compound" in the present specification is a compound that reacts with a polymerization factor (e.g., radicals) generated from a photopolymerization initiator (component (b)) to form a film of a polymer compound by a chain reaction (polymerization reaction).

An example of such a polymerizable compound is a radically polymerizable compound. The polymerizable compound serving as the component (a) may be composed of a single polymerizable compound or may be composed of a plurality of polymerizable compounds.

The radically polymerizable compound is preferably a compound having one or more acryloyl or methacryloyl groups, that is, a (meth)acrylic compound. Thus, the curable composition according to the present embodiment preferably contains a (meth)acrylic compound as the component (a). More preferably, the major proportion of the component (a) is a (meth)acrylic compound. Most preferably, the component (a) is a (meth)acrylic compound. "The major proportion of the component (a) is a (meth)acrylic compound" as recited herein indicates that 90% by weight or more of the component (a) is a (meth)acrylic compound.

If the radically polymerizable compound is composed of a plurality of compounds having one or more acryloyl or methacryloyl groups, they preferably include a monofunctional (meth)acrylic monomer and a polyfunctional (meth)acrylic monomer. This is because a combination of a monofunctional (meth)acrylic monomer and a polyfunctional (meth)acrylic monomer gives a cured film with high mechanical strength.

Examples of monofunctional (meth)acrylic compounds having one acryloyl or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth) acrylate, methoxypolypropylene glycol (meth)acrylate, diacetone (meth)acrylamide, isobutoxymethyl(meth)acrylamide, N,N-dimethyl(meth)acrylamide, t-octyl(meth)acrylamide, dimethylaminoethyl (meth)acrylate, diethylaminoethyl (meth)acrylate, 7-amino-3,7-dimethyloctyl (meth) acrylate, N,N-diethyl(meth)acrylamide, and N,N-dimethylaminopropyl(meth)acrylamide.

Examples of commercial products of the above monofunctional (meth)acrylic compounds include, but not limited to, ARONIX (registered trademark) M101, M102, M110, M111, M113, M117, M5700, TO-1317, M120, M150, and M156 (manufactured by Toagosei Co., Ltd.); MEDOL 10, MIBDOL 10, CHDOL 10, MMDOL 30, MEDOL 30, MIBDOL 30, CHDOL 30, LA, IBXA, 2-MTA, HPA, and Viscoat #150, #155, #158, #190, #192, #193, #220, #2000, #2100, and #2150 (manufactured by Osaka Organic Chemical Industry Ltd.); LIGHT ACRYLATE BO-A, EC-A, DMP-A, THF-A, HOP-A, HOA-MPE, HOA-MPL, PO-A, P-200A, NP-4EA, and NP-8EA and EPDXY ESTER M-600A (manufactured by Kyoeisha Chemical Co., Ltd.); KAYARAD (registered trademark) TC110S, R-564, and R-128H (manufactured by Nippon Kayaku Co., Ltd.); NK ESTER AMP-10G and AMP-20G (manufactured by Shin Nakamura Chemical Co., Ltd.); FA-511A, -512A, and -513A (manufactured by Hitachi Chemical Co., Ltd.); PHE, CEA, PHE-2, PHE-4, BR-31, BR-31M, and BR-32 (manufactured by DKS Co. Ltd.); VP (manufactured by BASF); and ACMO, DMAA, and DMAPAA (manufactured by Kohjin Co., Ltd.).

In addition, examples of polyfunctional (meth)acrylic compounds having two or more acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO/PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth) acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, tris(2-hydroxyethyl) isocyanurate tri(meth)acrylate, tris(acryloyloxy) isocyanurate, bis(hydroxymethyl)tricyclodecane di(meth)acrylate, dipentaerythritol penta(meth)acrylate, dipentaerythritol hexa(meth)acrylate, EO-modified 2,2-bis (4-((meth)acryloxy)phenyl)propane, PO-modified 2,2-bis(4-((meth)acryloxy)phenyl)propane, and EO/PO-modified 2,2-bis(4-((meth)acryloxy)phenyl)propane.

Examples of commercial products of the above polyfunctional (meth)acrylic compounds include, but not limited to, Yupimer (registered trademark) UV SA1002 and SA2007 (manufactured by Mitsubishi Chemical Corporation); Viscoat #195, #230, #215, #260, #335HP, #295, #300, #360, #700, GPT, and 3PA (manufactured by Osaka Organic Chemical Industry Ltd.); LIGHT ACRYLATE 4EG-A, 9EG-A, NP-A, DCP-A, BP-4EA, BP-4PA, TMP-A, PE-3A, PE-4A, and DPE-6A (manufactured by Kyoeisha Chemical Co., Ltd.); KAYARAD (registered trademark) PET-30, TMPTA, R-604, DPHA, DPCA-20, -30, -60, -120, HX-620, D-310, and D-330 (manufactured by Nippon Kayaku Co., Ltd.); ARONIX (registered trademark) M208, M210, M215, M220, M240, M305, M309, M310, M315, M325, and M400 (manufactured by Toagosei Co., Ltd.); and Ripoxy (registered trademark) VR-77, VR-60, and VR-90 (manufactured by Showa Highpolymer Co., Ltd.).

In the compound groups described above, "(meth)acrylate" refers to an acrylate or a methacrylate having the same alcohol residue as the acrylate. "(Meth)acryloyl group" refers to an acryloyl group or a methacryloyl group having the same alcohol residue as the acryloyl group. "EO" denotes ethylene oxide, and "EO-modified compound A" denotes a compound in which the (meth)acrylic acid residue and alcohol residue of the compound A are attached together via an ethylene oxide block structure. In addition, "PO" denotes propylene oxide, and "PO-modified compound B" denotes a compound in which the (meth)acrylic acid residue and alcohol residue of the compound B are attached together via a propylene oxide block structure.

<Component (B): Photopolymerization Initiator>

The component (b) is a photopolymerization initiator.

"Photopolymerization initiator" in the present specification is a compound that generates the above polymerization factor (radicals) by sensing light at a predetermined wavelength. Specifically, "photopolymerization initiator" is a polymerization initiator (radical generator) that generates radicals in response to light (radiation such as infrared light, visible light, ultraviolet light, far-ultraviolet light, X-rays, or charged particle beams such as electron beams).

The component (b) may be composed of a single photopolymerization initiator or may be composed of a plurality of photopolymerization initiators.

Examples of radical generators include, but not limited to, optionally substituted 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer; benzophenone derivatives such as benzophenone, N, N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives such as 2-benzyl-2-dimethylamino-1-(4-morpholinophenyl)-butanone-1 and 2-methyl-1-[4-(methylthio)phenyl]-2-morpholino-propan-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropylthioxanthone, and 2-chlorothioxanthone; acylphosphine oxide derivatives such as 2,4,6-trimethylbenzoyldiphenylphosphine oxide, bis(2,4,6-trimethylbenzoyl)phenylphosphine oxide, and bis-(2,6-dimethoxybenzoyl)-2,4,4-trimethylpentylphosphine oxide; oxime ester derivatives such as 1,2-octanedione, 1-[4-(phenylthio)-,2-(O-benzoyloxime)], ethanone, and 1-[9-ethyl-6-(2-methylbenzoyl)-9H-carbazol-3-yl]-,1-(O-acetyloxime);

and xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenylpropan-1-one.

Examples of commercial products of the above radical generators include, but not limited to, Irgacure 184, 369, 651, 500, 819, 907, 784, 2959, CGI-1700, -1750, -1850, and CG24-61, Darocur 1116 and 1173, and Lucirin (registered trademark) TPO, LR8893, and LR8970 (manufactured by BASF); and Ebecryl P36 (manufactured by UCB Chemicals).

Of these, the component (b) is preferably an acylphosphine oxide-based polymerization initiator. Of the above examples, acylphosphine oxide-based polymerization initiators are acylphosphine oxide compounds such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide.

In the present invention, the component (b), which is a photopolymerization initiator, is preferably mixed in the curable composition (A) in a proportion of from 0.1% by weight to 50% by weight, more preferably from 0.1% by weight to 20% by weight, even more preferably from more than 10% by weight to 20% by weight, based on the total weight of the component (a), the component (b), and the components (c) and (d) described later, i.e., the total weight of all components excluding the solvent component (e).

If the component (b) is mixed in the curable composition (A) in a proportion of 0.1% by weight or more based on the total weight of the component (a), the component (b), the component (c), and the component (d), the composition can be cured at high speed, thus improving the reaction efficiency. On the other hand, if the component (b) is mixed in a proportion of 50% by weight or less based on the total weight of the component (a), the component (b), the component (c), and the component (d), the resulting cured film has a certain mechanical strength.

<Component (C): Internal Release Agent>

As the internal release agent, for example, surfactants such as fluorinated surfactants, silicone-based surfactants, and hydrocarbon-based surfactants can be used. The internal release agent in the present invention is not polymerizable.

Fluorinated surfactants include, for example, polyalkylene oxide (e.g., polyethylene oxide or polypropylene oxide) adducts of alcohols having a perfluoroalkyl group and polyalkylene oxide (e.g., polyethylene oxide or polypropylene oxide) adducts of perfluoropolyethers. Fluorinated surfactants may have, for example, a hydroxyl group, an alkoxy group, an alkyl group, an amino group, or a thiol group as a part (e.g., an end group) of the molecular structure.

Commercial products may be used as fluorinated surfactants. Examples of commercial products include MEGAFAC (registered trademark) F-444, TF-2066, TF-2067, and TF-2068 (manufactured by DIC Corporation); FLUORAD FC-430 and FC-431 (manufactured by Sumitomo 3M Limited); SURFLON (registered trademark) S-382 (manufactured by AGC Inc.); EFTOP EF-122A, -122B, -122C, EF-121, EF-126, EF-127, and MF-100 (manufactured by Tohkem Products Corporation); PF-636, PF-6320, PF-656, and PF-6520 (manufactured by OMNOVA Solutions Inc.); UNIDYNE (registered trademark) DS-401, DS-403, and DS-451 (manufactured by Daikin Industries, Ltd.); and FTERGENT (registered trademark) 250, 251, 222F, and 208G (manufactured by Neos Company Limited).

The internal release agent may also be a hydrocarbon-based surfactant.

Hydrocarbon-based surfactants include, for example, alkyl alcohol polyalkylene oxide adducts in which an alkylene oxide having 2 to 4 carbon atoms is added to an alkyl alcohol having 1 to 50 carbon atoms.

Examples of alkyl alcohol polyalkylene oxide adducts include methyl alcohol ethylene oxide adducts, decyl alcohol ethylene oxide adducts, lauryl alcohol ethylene oxide adducts, cetyl alcohol ethylene oxide adducts, stearyl alcohol ethylene oxide adducts, and stearyl alcohol ethylene oxide/propylene oxide adducts. The end groups of the alkyl alcohol polyalkylene oxide adducts are not limited to those of alkyl alcohol polyalkylene oxide adducts that can be manufactured simply by adding a polyalkylene oxide to an alkyl alcohol, namely, hydroxyl groups. These hydroxyl groups may be replaced by other substituents, including, for example, polar functional groups such as carboxyl groups, amino groups, pyridyl groups, thiol groups, and silanol groups and hydrophobic functional groups such as alkyl groups and alkoxy groups.

Commercial products may be used as alkyl alcohol polyalkylene oxide adducts. Examples of commercial products include polyoxyethylene methyl ethers (methyl alcohol ethylene oxide adducts) manufactured by Aoki Oil Industrial Co., Ltd. (BLAUNON MP-400, MP-550, and MP-1000); polyoxyethylene decyl ethers (decyl alcohol ethylene oxide adducts) manufactured by Aoki Oil Industrial Co., Ltd. (FINESURF D-1303, D-1305, D-1307, and D-1310); polyoxyethylene lauryl ethers (lauryl alcohol ethylene oxide adducts) manufactured by Aoki Oil Industrial Co., Ltd. (BLAUNON EL-1505); polyoxyethylene cetyl ethers (cetyl alcohol ethylene oxide adducts) manufactured by Aoki Oil Industrial Co., Ltd. (BLAUNON CH-305 and CH-310); polyoxyethylene stearyl ethers (stearyl alcohol ethylene oxide adducts) manufactured by Aoki Oil Industrial Co., Ltd. (BLAUNON SR-705, SR-707, SR-715, SR-720, SR-730, and SR-750); random-polymerized polyoxyethylene polyoxypropylene stearyl ethers manufactured by Aoki Oil Industrial Co., Ltd. (BLAUNON SA-50/50 1000R and SA-30/70 2000R); polyoxyethylene methyl ethers manufactured by BASF (Pluriol (registered trademark) A760E); and polyoxyethylene alkyl ethers manufactured by Kao Corporation (Emulgen series).

The internal release agents may be used alone or in a mixture of two or more thereof.

The component (c) is preferably mixed in the curable composition in a proportion of from 0% by weight to 50% by weight, more preferably from 0.1% by weight to 50% by weight, even more preferably from 0.1% by weight to 20% by weight, based on the total weight of the component (a), the component (b), the component (c), and the component (d) described later, i.e., the total weight of all components excluding the solvent.

The inventors have found that a curable composition (A) containing a certain amount or more of a fluorinated surfactant has a large contact angle on an underlayer, described later, because of a pinning effect. Thus, it is preferred to use at least a fluorinated surfactant as the internal release agent in the present invention.

The fluorinated surfactant is preferably mixed in the curable composition in a proportion of from 0.50% by weight to 2.0% by weight based on the total weight of the component (a), the component (b), the component (c), and the component (d) described later, i.e., the total weight of all components excluding the solvent.

<Component (D): Other Nonpolymerizable Compound>

In addition to the components (a), (b), and (c) described above, the curable composition (A) according to the present embodiment may further contain a nonpolymerizable compound as the component (d) for various purposes as long as the compound does not interfere with the advantages of the present invention. An example of such a component (d) is a compound that does not have a polymerizable functional group such as a (meth)acryloyl group and that does not have the ability to generate the above polymerization factor (radicals) by sensing light at a predetermined wavelength. Examples of such compounds include sensitizers, hydrogen donors, antioxidants, polymer components, and other additives. The curable composition (A) may contain a plurality of such compounds as the component (d).

Sensitizers are compounds that are added as appropriate in order to promote the polymerization reaction and to improve the reaction conversion rate. Examples of sensitizers include sensitizing dyes.

Sensitizing dyes are compounds that are excited by absorbing light at a particular wavelength and interact with the photopolymerization initiator serving as the component (b). "Interact" as recited herein refers to, for example, energy transfer or electron transfer from the excited sensitizing dye to the photopolymerization initiator serving as the component (b).

Specific examples of sensitizing dyes include, but not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine-based dyes, thiopyrylium salt-based dyes, merocyanine-based dyes, quinoline-based dyes, styrylquinoline-based dyes, ketocoumarin-based dyes, thioxanthene-based dyes, xanthene-based dyes, oxonol-based dyes, cyanine-based dyes, Rhodamine-based dyes, and pyrylium salt-based dyes.

The sensitizers may be used alone or in a mixture of two or more thereof.

Hydrogen donors are compounds that react with initiator radicals generated from the photopolymerization initiator serving as the component (b) and radicals at growing ends of polymer chains to generate more reactive radicals. It is preferred to add a hydrogen donor if the photopolymerization initiator serving as the component (b) is a photoradical generator.

Specific examples of such hydrogen donors include, but not limited to, amine compounds such as n-butylamine, di-n-butylamine, tri-n-butylphosphine, allylthiourea, s-benzylisothiouronium-p-toluenesulfinate, triethylamine, diethylaminoethyl methacrylate, triethylenetetramine, 4,4'-bis(dialkylamino)benzophenone, ethyl N,N-dimethylaminobenzoate, isoamyl N,N-dimethylaminobenzoate, pentyl-4-dimethylaminobenzoate, triethanolamine, and N-phenylglycine; and mercapto compounds such as 2-mercapto-N-phenylbenzimidazole and mercaptopropionates.

The hydrogen donors may be used alone or in a mixture of two or more thereof. In addition, the hydrogen donors may function as sensitizers.

An internal release agent can be added to the curable composition to reduce the interfacial bonding force between the mold and the curable composition (A), that is, to reduce the release force in a release step, described later. "Internal" in the present specification means that the release agent is added to the curable composition in advance before the step of depositing the curable composition.

The component (d), which is another nonpolymerizable compound, is preferably mixed in the curable composition in a proportion of from 0% by weight to 50% by weight, more preferably from 0.1% by weight to 50% by weight, even more preferably from 0.1% by weight to 20% by weight, based on the total weight of the component (a), the component (b), and the component (c), i.e., the total weight of all components excluding the solvent.

If the component (d) is mixed in a proportion of 50% by weight or less based on the total weight of the component (a), the component (b), and the component (c), the resulting cured film has a certain mechanical strength.

<Component (E): Solvent>

The curable composition according to the present embodiment may contain a solvent as the component (e). There is no particular limitation as to the component (e) as long as the component (a), the component (b), the component (c), and the component (d) are soluble in the solvent. Preferred solvents are solvents having a boiling point of from 80° C. to 200° C. under normal pressure. More preferred are solvents having at least one of an ester structure, a ketone structure, a hydroxyl group, or an ether structure, specifically, a single solvent or a mixture of solvents selected from propylene glycol monomethyl ether acetate, propylene glycol monomethyl ether, cyclohexanone, 2-heptanone, γ-butyrolactone, and ethyl lactate.

The curable composition (A) according to the present embodiment preferably does not contain the component (e).

<Temperature During Preparation of Curable Composition>

To prepare the curable composition (A1) according to the present embodiment, at least the component (a), the component (b), the component (c), and the component (d) are mixed and dissolved under predetermined temperature conditions, specifically, in the range from 0° C. to 100° C. The same applies if the curable composition (A) contains the component (e).

<Viscosity of Curable Composition>

The curable composition (A) according to the present embodiment is preferably a liquid. This is because the spread and fill of such a curable composition (A1) are quickly completed in a mold contact step, described later, that is, because the filling time is short.

A mixture of the components excluding the solvent (component (e)) of the curable composition (A) according to the present embodiment preferably has a viscosity at 25° C. of from 1 mPa·s to 1,000 mPa·s, more preferably from 1 mPa·s to 500 mPa·s, even more preferably from 1 mPa·s to 100 mPa·s.

If the curable composition (A) has a viscosity of 100 mPa·s or less, spread and fill are quickly completed when the curable composition (A) is brought into contact with the mold. That is, the use of the curable composition according to the present embodiment allows a photo-nanoimprint process to be performed at high throughput. In addition, pattern defects due to poor filling are unlikely to occur.

On the other hand, if the curable composition (A) has a viscosity of 1 mPa·s or more, coating unevenness is unlikely to occur when the curable composition (A) is applied to the underlayer. Furthermore, the curable composition (A) is unlikely to flow out through the ends of the mold when the curable composition (A) is brought into contact with the mold.

<Surface Tension of Curable Composition>

A composition composed of the components excluding the solvent (component (e)) of the curable composition (A) according to the present embodiment preferably has a surface tension at 23° C. of from 5 mN/m to 70 mN/m, more preferably from 7 mN/m to 50 mN/m, even more preferably from 10 mN/m to 40 mN/m. Here, a higher surface tension, for example, 5 mN/m or more, produces a stronger capillary force and thus allows filling (spread and fill) to be completed within a shorter period of time when the curable composition (A) is brought into contact with the mold.

On the other hand, if the curable composition (A) has a surface tension of 70 mN/m or less, a cured film obtained by curing the curable composition has a smooth surface.

<Contact Angle of Curable Composition>

It is preferred that the contact angle of a composition composed of the components excluding the solvent (component (e)) of the curable composition (A) according to the present embodiment on the surface of the substrate (including the case of the surface of the underlayer) be greater than the stair angle of the stair structure of the recesses of the mold and be less than 90°. If the contact angle is smaller than the stair angle, the curable composition (A) first comes into contact with the stair structure of the recesses during imprinting with the mold, and gas tends to remain near the bottom surfaces of the recesses of the mold; thus, it takes time to fill the recesses. On the other hand, if the contact angle on the surface of the underlayer is 90° or more, the capillary force acts in the negative direction (in the direction in which the contact interface between the mold pattern and the curable composition shrinks) inside the mold pattern and in the gap between the underlayer and the mold; thus, the recesses are less easily filled. Furthermore, the contact angle on the surface of the mold is preferably smaller than or equal to the contact angle on the surface of the substrate. As the contact angle on the surface of the mold becomes smaller relative to the contact angle on the surface of the underlayer, the surface of the mold exhibits a higher wettability, and the recesses can be filled with the curable composition (A) at a higher speed from the surface side thereof after contact with the mold. Accordingly, gas is forced in the plane direction of the substrate and is more easily released.

The contact angles of the curable composition (A) on the surface of the substrate and the surface of the mold typically have different values. For example, if the stair angle is 10°, the contact angles on the surface of the substrate and the surface of the mold are each preferably more than 10° and less than 90°.

In particular, from the viewpoint that the curable composition (A) is an imprint curable composition for use in a method for manufacturing a cured product pattern, if the contact angle ($\theta_U$) of the imprint curable composition on the surface of the substrate is more than 10° and less than 90°, droplets that can be brought into contact with the bottom surfaces of the mold can be formed on the surface of the substrate. In a more preferred embodiment, the contact angle ($\theta_S$) of the imprint curable composition on the surface of the mold is smaller than the contact angle ($\theta_U$) on the surface of the substrate or the surface of the underlayer, which facilitates spreading of droplets of the curable composition brought into contact with the bottom surfaces of the mold into the recesses.

In addition, the difference between the contact angle of the curable composition (A) on the surface of the substrate (the surface of the underlayer) and the stair angle of the stair pattern of the mold is preferably at least 5° or more, more preferably from 5° to less than 35°, even more preferably from 10° to less than 35°.

For example, if the stair angle is 10°, the difference is preferably more than 15° and less than 45°, more preferably more than 20° and less than 45°.

<Impurities Present in Curable Composition>

The curable composition (A) according to the present embodiment preferably contains as little impurities as possible. "Impurities" as recited herein refers to components other than the components (a), (b), (c), (d), and (e) described above.

Thus, the curable composition according to the present embodiment is preferably a composition obtained through a purifying step. This purifying step is preferably, for example, filtration using a filter.

If filtration using a filter is performed, specifically, after the component (a), the component (b), and the additive components that are added as needed described above are mixed together, the mixture is preferably filtered through a filter having a pore size of, for example, from 0.001 µm to 5.0 µm. More preferably, if filtration using a filter is performed, it is performed in multiple steps or repeated multiple times. In addition, the filtrate may be filtered again. Filtration may also be performed using a plurality of filters having different pore sizes. Although there is no particular limitation as to the filter used for filtration, filters such as polyethylene resin filters, polypropylene resin filters, fluorocarbon resin filters, and nylon resin filters can be used.

Through this purifying step, impurities such as particles present in the curable composition can be removed. Thus, it is possible to prevent the formation of pattern defects due to surface irregularities unexpectedly formed by impurities such as particles on a cured film obtained after the curing of the curable composition.

If the curable composition according to the present embodiment is used for the manufacture of semiconductor integrated circuits, it is preferred to minimize the presence of impurities containing metal atoms (metal impurities) in the curable composition so that they do not interfere with the operation of the products. In this case, the concentration of metal impurities present in the curable composition is preferably 10 ppm or less, more preferably 100 ppb or less.

<Substrate>

Although there is no particular limitation as to the substrate used in the present invention, silicon substrates for use in the manufacture of semiconductor integrated circuits, glass substrates, quartz substrates, and organic polymer substrates such as PET and PE for use in applications such as liquid crystals and optical components (filters and DOE lenses), and other substrates can be used as appropriate.

To improve the adhesion to a cured product pattern of the curable composition, it is preferred to deposit an underlayer, described later, on the surface of the substrate.

<Material for Surface of Substrate (Underlayer)>

The contact angle of the curable composition (A) on the underlayer is determined by the interaction between the curable composition and the underlayer. As a result of intensive research, the inventors of the present invention have found that the curable composition of the present invention exhibits a large contact angle on a substrate having a carbon material deposited thereon as an underlayer and that the curable composition exhibits good adhesion to the surface of the underlayer formed from the carbon material.

In particular, the inventors have found that the curable composition (A) adheres strongly to the layer to be processed after curing in a light irradiation step if the proportion of the number of carbon atoms relative to the total number of atoms in the carbon material is about 80% by weight or more. The proportion of the number of carbon atoms in the carbon material is about 80% by weight or more, more preferably 80% to 95% by weight.

Examples of carbon materials include spin-on carbon (SOC), diamond-like carbon, and graphite. SOC can particularly preferably be used.

A precursor composition for SOC is a carbon-based material, for example, a mixture of a naphthalene-based compound and a solvent, and is applied to the substrate by a spin coating process. Typically, the composition is applied so as to have a thickness of 0.1 nm to 1,000 nm after baking. It is preferred to apply a sufficient amount of the composition to achieve uniform flatness over the surface of the substrate. After coating, the substrate is baked to volatilize the solvent component, followed by carbonization to form a carbon film in which the proportion of the number of carbon atoms is about 80% by weight or more. The baking conditions are adjusted as appropriate depending on the type of composition used. Typically, baking is performed at a temperature of 180° C. or higher, preferably at about 200° C. to about 350° C. for about 30 to 90 seconds, particularly preferably at about 220° C. to about 300° C. for about 45 to 60 seconds.

<Mold>

As the mold according to the present invention, it is preferred to use a mold formed of an optically transparent material by taking into account the light irradiation step, described later. Specific examples of materials for the mold include glass, quartz, optically transparent resins such as PMMA and polycarbonate resins, transparent metal deposited films, soft films such as polydimethylsiloxane, photocured films, and metal films.

It should be noted that, if an optically transparent resin is used as the material for the mold, it is necessary to select a resin that does not dissolve in the components present in the curable composition (A). Quartz, which has a small thermal expansion coefficient and exhibits little pattern strain, is particularly preferred as the material for the mold.

Figure 3A:
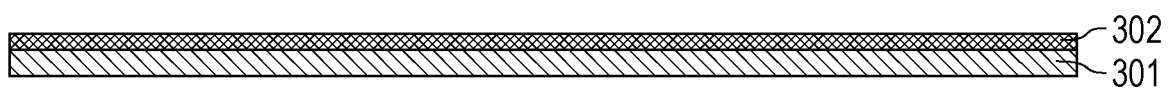
FIG. 3A is a schematic sectional view illustrating a photo-nanoimprint technique according to the present embodiment.
Figure 3B:
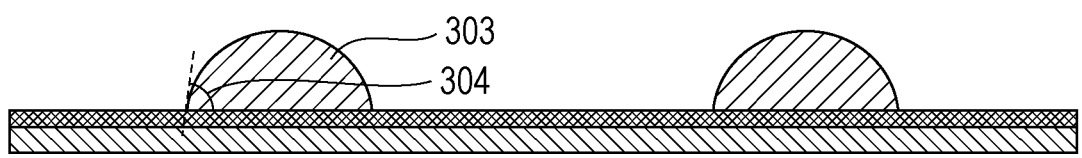
FIG. 3B is a schematic sectional view illustrating the photo-nanoimprint technique according to the present embodiment.
Figure 3C:
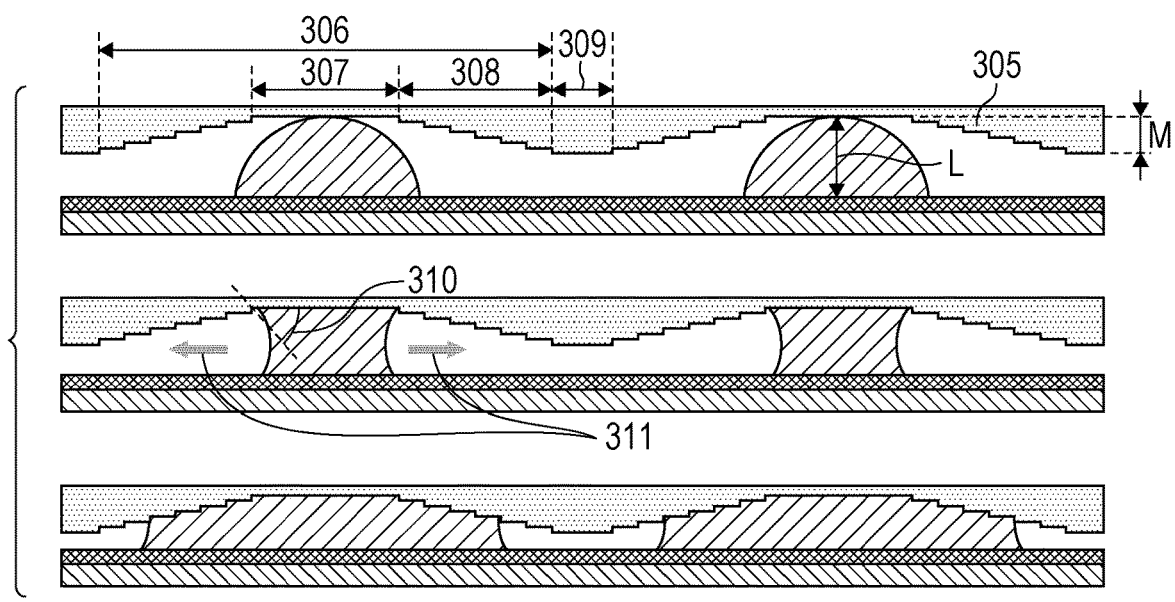
FIG. 3C includes schematic sectional views illustrating the photo-nanoimprint technique according to the present embodiment.
Figure 3D:
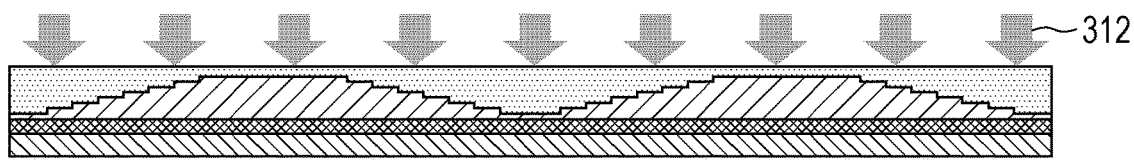
FIG. 3D is a schematic sectional view illustrating the photo-nanoimprint technique according to the present embodiment.

As shown in FIGS. 3C and 3D, the mold used in the present invention has recesses having a bottom surface and a stair structure arranged to form an opening that becomes wider from the bottom surface toward the surface of the mold.

As the depth from the surface of the mold to the bottom surfaces (M in FIG. 3C), which corresponds to the pattern height, becomes smaller, the force by which a mold 305 is stripped from a photocured film 313 of a curable composition (A) 303 in a release step [5], described later, that is, the release force, becomes smaller, and the number of release defects that occur when the resist pattern tears and remains on the mask side upon release also becomes smaller. Due to elastic deformation of the resist pattern upon impact during the stripping of the mold, adjacent portions of the resist pattern may come into contact with and adhere to each other, and the resist pattern may be damaged thereby. In this case, if the pattern height is about twice or less the pattern width (an aspect ratio of 2 or less), such problems are likely to be avoided. On the other hand, if the pattern height is too small, the accuracy with which the substrate to be processed is processed, for example, by etching, decreases.

The mold may be subjected to surface treatment before this step, i.e., the step of bringing the mold into contact with the curable composition (A), to improve the releasability of the surface of the mold from the curable composition (A). An example method of surface treatment is a method in which a release agent is applied to the surface of the mold to form a release agent layer. Here, examples of release agents for application to the surface of the mold 305 include silicone-based release agents, fluorinated release agents, hydrocarbon-based release agents, polyethylene-based release agents, polypropylene-based release agents, paraffin-based release agents, montan-based release agents, and carnauba-based release agents. For example, commercially available coating-type release agents such as OPTOOL (registered trademark) DSX manufactured by Daikin Industries, Ltd. are also suitable for use. The release agents may be used alone or in a combination of two or more thereof. Of these, fluorinated and hydrocarbon-based release agents are particularly preferred.

Figure 2A:
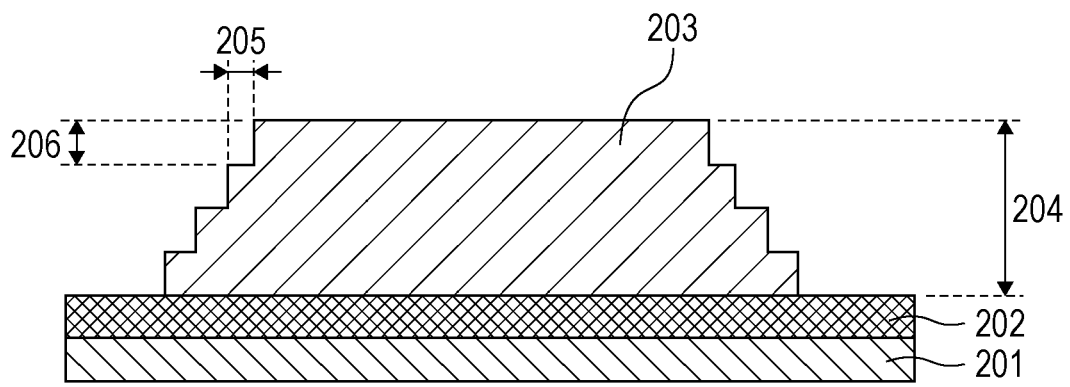
FIG. 2A is a schematic view illustrating, in outline, a stair pattern for 3D NAND flash memory.
Figure 2B:
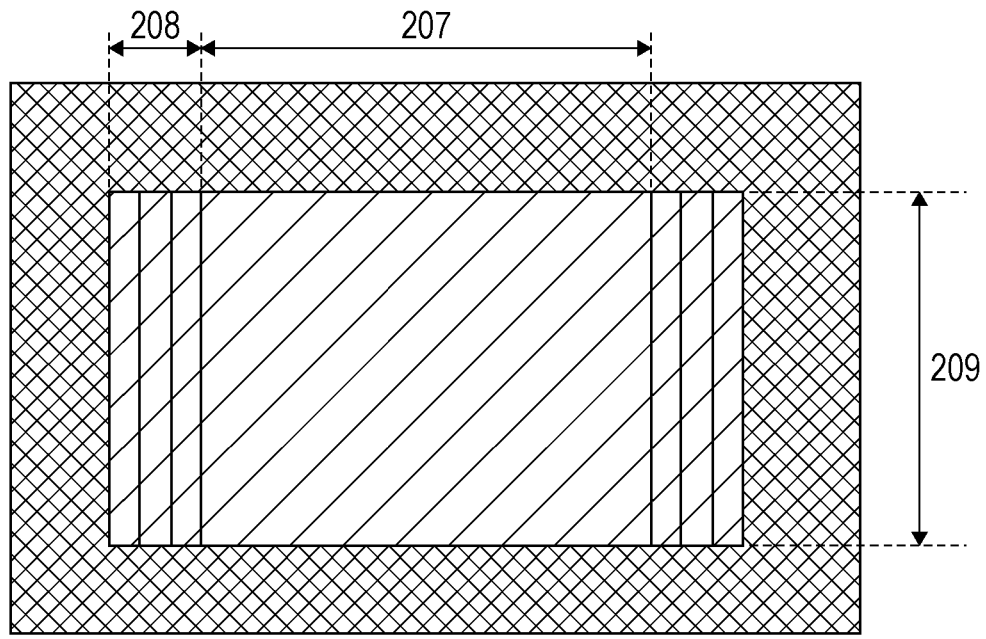
FIG. 2B is a schematic view illustrating, in outline, the stair pattern for 3D NAND flash memory.

Although the recesses of the mold may have a bottom surface of any shape such as a circle, a rectangle, or a polygon, the recesses preferably have a rectangular flat bottom surface so that the flat portion of the stair pattern as shown in FIGS. 2A and 2B can be formed. In this case, the bottom surfaces preferably have an area of 0.25 mm$^2$ or more, more preferably 1 mm$^2$ or more. In addition, the size of the bottom surfaces is preferably 500 µm or more in length and 500 µm or more in width.

Figure 4:
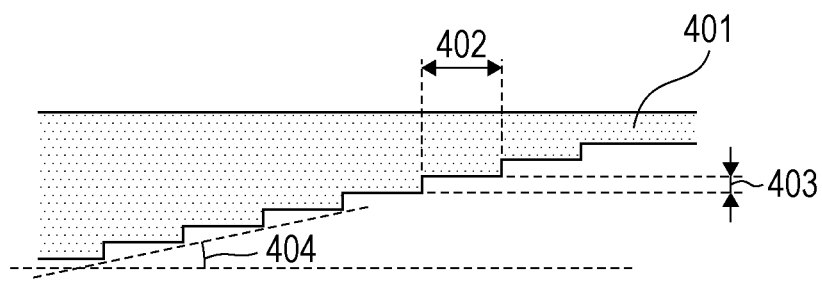
FIG. 4 is a schematic sectional view illustrating a stair portion of a mold.

As shown in FIG. 4, the size of the stair portions forming the sidewall surfaces of the recesses of the mold can be defined by the tread size D and the riser size H. The tread size D and the riser size H may each be any size. For example, the tread size D is 10 nm to 100 µm, and the riser size H is 10 nm to 100 µm. The stair angle ($\theta_S$) representing the slope of the sidewall surfaces of the mold can be calculated from $\theta_S = \cot^{-1}(D/H)$.

Although any number of steps can be set as needed, the number of steps is from 2 to 5,000 steps, preferably from 5 to 500 steps, more preferably from 10 to 200 steps.

The stair angle of each step of the stair structure is preferably identical; that is, the steps are preferably arranged at constant stair angle. However, the stair angle of each step may differ from each other. For example, the stair structure may be configured such that the stair angle decreases, increases, or changes regularly (periodically) from the bottom surfaces of the recesses of the mold toward the surface of the mold.

In this case, it is preferred that the smallest stair angle be greater than the contact angle of the curable composition on the surface of the substrate. It is preferred to adjust the area of the bottom surfaces of the recesses of the mold and the area of the droplets of the curable composition deposited on the substrate, and it is preferred that the area of the bottom surfaces be greater than the area of the droplets of the curable composition deposited.

In addition, it is preferred to adjust the spatial volume of the recesses of the mold and the volume of the droplets of the curable composition deposited on the substrate, and it is preferred that the volume (V1) of the droplets be the sum of the spatial volume (V2) of the recesses of the mold and the volume (V3) of the remaining gap portions.

Embodiment

Next, a pattern-forming method according to the embodiment will be described with reference to the schematic sectional views of FIGS. 3A to 3E.

The pattern-forming method according to the present embodiment is one form of photo-nanoimprint method. The pattern-forming method according to the present embodiment includes the steps of:

on a substrate,

[1] depositing an underlayer;

[2] discretely depositing droplets of a liquid curable composition (A) containing at least a polymerizable compound (a) on a surface of the underlayer;

[3] bringing a mold having an uneven pattern formed therein into contact with the curable composition (A);

[4] curing the liquid curable composition (A) by irradiation with light from the mold side; and

[5] releasing the mold from the cured layer of the curable composition.

A cured film obtained by the method for manufacturing a cured film having a pattern shape according to the present embodiment is preferably a film having a pattern with a size of from 1 nm to 10 mm, more preferably a film having a pattern with a size of from 10 nm to 100 μm. In general, a pattern-forming technique in which light is used to fabricate a film having a nano-sized (from 1 nm to 100 nm) pattern (uneven structure) is called a photo-nanoimprint process. The pattern-forming method according to the present embodiment uses a photo-nanoimprint process.

The individual steps will hereinafter be described.

<First Deposition Step [1]>

In this step (first deposition step), as shown in FIG. 3A, an underlayer 302 according to the present embodiment as described above is deposited (applied) on a substrate 301 and is baked to form an underlayer. Examples of processes that can be used to deposit the underlayer 302 on the substrate 301 or the layer to be processed in the present embodiment include inkjet processes, dip coating processes, air knife coating processes, curtain coating processes, wire bar coating processes, gravure coating processes, extrusion coating processes, spin coating processes, and slit scan processes. In the present invention, spin coating processes are particularly preferred.

If a spin coating process is used to deposit the underlayer 302 on the substrate 301 or the layer to be processed, a baking step is performed as needed to volatilize the solvent component. As the baking conditions, baking is performed at about 200° C. to about 350° C. for about 30 seconds to about 90 seconds. The baking conditions are adjusted as appropriate depending on the type of composition used.

Although the average thickness of the underlayer 302 varies depending on the intended use, the average thickness is, for example, from 0.1 nm to 10,000 nm, preferably from 1 nm to 350 nm, particularly preferably from 1 nm to 250 nm.

<Second Deposition Step [2]>

In this step (second deposition step), as shown in FIG. 3B, droplets of a curable composition (A) 303 are preferably discretely dispensed and deposited onto the underlayer 302. Although common spotting methods and liquid ejection means can be used as the deposition method, inkjet processes are particularly preferred.

In the present invention, it is preferred to deposit only one droplet (single droplet) of the curable composition (A) 303 for one recess of the mold. The single droplet may also be formed by combining a plurality of separately ejected (dispensed) droplets together on the surface of the substrate or the underlayer.

If the liquid ejection means includes a nozzle as in an inkjet process, a droplet is preferably ejected only once from the nozzle to the position of the substrate corresponding to one recess. Alternatively, the liquid may be ejected twice or more from the same nozzle to the same position such that the droplets are stacked on top of each other to form a larger droplet, or the same curable composition may be ejected from different nozzles.

The height (L in FIG. 3C) of the droplets immediately before the mold contact step, described later, is preferably greater than the depth (M in FIG. 3C) from the surface of the mold to the bottom surfaces. This is because the tops of the droplets can be easily brought into contact with the bottom surfaces of the recesses of the mold, and by bringing the mold closer to the substrate after contact, its pressure can be used to spread the droplets in the plane direction of the substrate.

In addition, it is preferred that the contact angle $\theta_U$ 304 of the droplets of the curable composition (A) 303 on the underlayer 302 be greater than the stair angle $\theta_S$ 404 of a mold 401 shown in FIG. 4, described later, and be less than 90°.

If the contact angle $\theta_U$ 304 is greater than the stair angle $\theta_S$, the droplets of the curable composition (A) 303 can be first brought into contact with flat portions 307 of the recesses of the mold shown in FIG. 3C, rather than stair portions 308 of the recesses, in the subsequent mold contact step. On the other hand, if the contact angle $\theta_U$ 304 is less than 90°, sufficient filling performance is ensured in the lateral direction. The stair angle $\theta_S$ is calculated from the sizes of treads 402 and risers 403 shown in FIG. 4 and can be determined as stair angle $\theta_S = \cot^{-1}(D/H)$, where D is the tread size, and H is the riser size.

<Mold Contact Step [3]>

FIG. 3C illustrates a mold contact state in this step (mold contact step 3).

As shown in FIG. 3C, a stair pattern portion 306 of one recess of the mold 305 used in this step (mold contact step 3) is composed of a flat portion 307, a stair portion 308, and a remaining film portion 309. The stair angle $\theta_S$ 404 described above is preferably less than 90°.

During imprinting with the mold, the tops of the droplets of the curable composition (A) 303 deposited in this step first come into contact with the flat portions 307 of the recesses. The droplets then spread in the lateral direction (311 indicates the direction in which the droplets spread) so as to be pressed as the mold is lowered, and gas is forced to the remaining film portions 309. Because the gap between the underlayer and the mold at the remaining film portions is several nanometers to several tens of nanometers, a strong capillary force acts, thus applying high pressure to the gas, which diffuses quickly over the mold and the surface of the underlayer and disappears. Thus, the recesses of the pattern of the mold 305 are filled (fill) with the curable composition (A) 303. By bringing one droplet into contact with each recess of the mold, the entrapment of gas bubbles after contact with the mold can be reduced, and filling can be accomplished within a short period of time. In addition, the contact angle $\theta_M$ 10 of the droplets of the curable composition (A) 303 on the mold 305 is preferably smaller than the contact angle $\theta_U$ 304 of the droplets of the curable composition (A) 303 on the underlayer 302. Thus, the droplets of the curable composition (A) 303 spread easily from the contact surface of the mold. This facilitates filling of the recesses with the curable composition and also reduces the likelihood of formation of gas bubbles at the stair portions of the mold. In addition, a certain height of contact angle is required on the surface of the substrate to maintain the shape of the droplets upon contact with the mold. Accordingly, if the contact angle of the opposing surface of the mold is smaller than the surface of the substrate, a decrease in filling performance can be avoided.

Figure 5A:
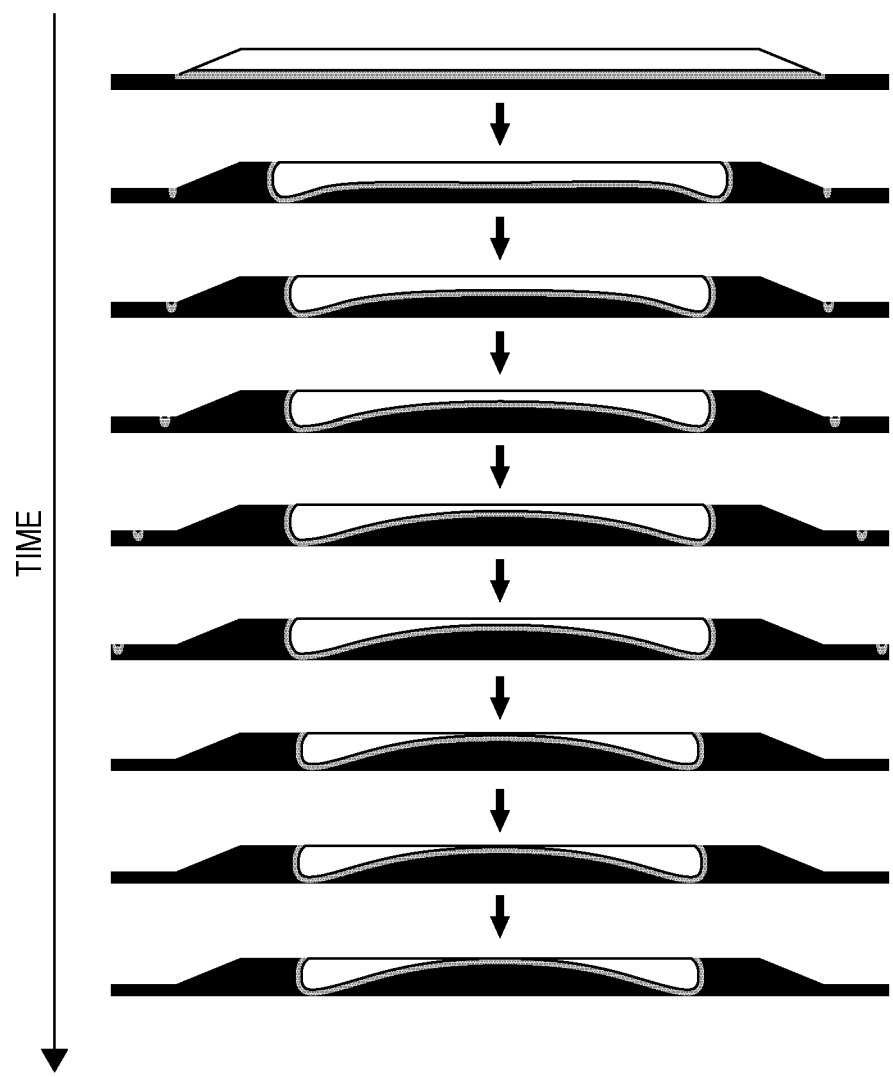
FIG. 5A is a schematic view of a simulation of how a mold having a stair pattern is filled in a conventional photo-nanoimprint method and a photo-nanoimprint method of the present invention.
Figure 5B:
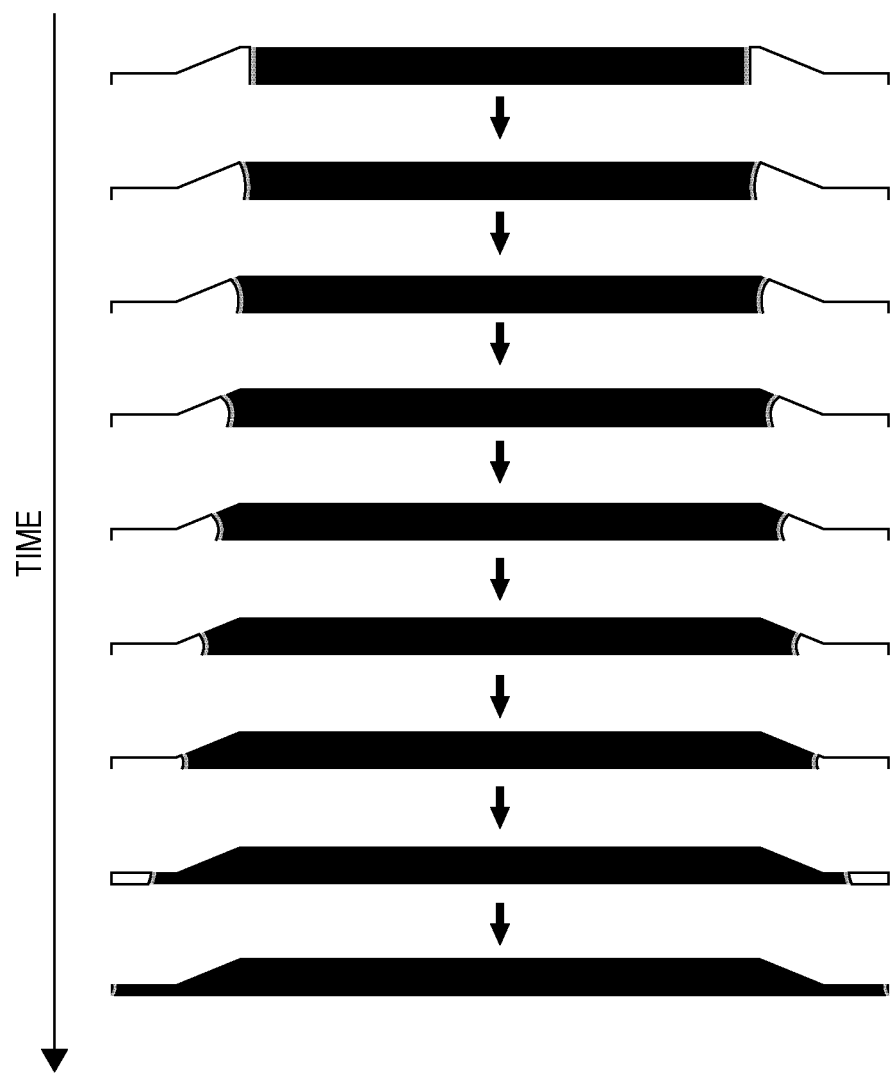
FIG. 5B is a schematic view of the simulation of how a mold having a stair pattern is filled in the conventional photo-nanoimprint method and the photo-nanoimprint method of the present invention.

The results of a simulation for calculating how the recesses of the mold are filled with the droplets of the curable composition (A) 303 are shown in FIGS. 5A and 5B (the simulation was performed using "Ansys Fluent 17.2" manufactured by Ansys, Inc. under the following conditions: the contact angle of the curable composition on the underlayer was 0° or 17°, and the stair angle was 11.3°).

FIG. 5A shows a case in which the curable composition (A) is applied by spin coating as disclosed in U.S. Pat. No.

9,147,87. During imprinting with the mold, the curable composition (A) first comes into contact with the protruding portions (remaining film portions) of the mold, and gas remains in the recesses (at the flat portions of the stair pattern) of the mold. Because the gap between the underlayer and the mold at the flat portions of the stair pattern is several micrometers, the capillary force is weak, and accordingly the pressure applied to the gas is weak; thus, the liquid spreads slowly. In contrast, FIG. 5B shows the imprint method according to the present invention. During imprinting with the mold, the curable composition (A) first comes into contact with the bottom surfaces (flat portions) of the recesses of the mold and completely fills the stair pattern while forcing gas to the remaining film portions.

In this step (mold contact step), as shown in FIG. 3C, there is no particular limitation as to the pressure applied to the curable composition (A) 303 when the mold 305 is brought into contact with the curable composition (A) 303. The pressure is preferably from 0 MPa to 100 MPa, more preferably from 0 MPa to 50 MPa, even more preferably from 0 MPa to 30 MPa, further preferably from 0 MPa to 20 MPa.

As described above, because the spread and fill of the curable composition (A) 303 are quickly completed in this step, the time during which the mold 305 is in contact with the curable composition (A) 303 can be set to a short period of time. That is, one of the advantages of the present invention is that high productivity can be achieved since many pattern-forming processes can be completed within a short period of time. Although there is no particular limitation as to the contact time, it is preferably, for example, from 0.1 seconds to 600 seconds, more preferably from 0.1 seconds to 3 seconds, particularly preferably from 0.1 seconds to 1 second. If the contact time is shorter than 0.1 seconds, defects called unfilling defects tend to occur frequently because of insufficient spread and fill.

Although this step can be performed in any of an air atmosphere, a reduced-pressure atmosphere, and an inert gas atmosphere, a reduced-pressure atmosphere and an inert gas atmosphere are preferred because they can prevent the influence of oxygen and moisture on the curing reaction. Specific examples of inert gases that can be used when this step is performed in an inert gas atmosphere include nitrogen, carbon dioxide, helium, argon, various fluorocarbon gases, and mixtures thereof. If this step is performed in a particular gas atmosphere, including an air atmosphere, the preferred pressure is from 0.0001 atm to 10 atm.

<Light Irradiation Step [4]>

Next, as shown in FIG. 3D, the curable composition (A) 303 is irradiated with irradiation light 312 through the mold 305. More specifically, the curable composition (A) 303 filling the fine pattern of the mold is irradiated with the irradiation light 312 through the mold 305. Thus, the curable composition (A) 303 filling the fine pattern of the mold 305 is cured by irradiation with the irradiation light 312 to form a cured film 313 having a pattern shape.

Here, the irradiation light 312 with which the curable composition (A) filling the stair pattern portions 306 of the mold 305 is irradiated is selected depending on the sensitivity wavelength of the curable composition (A) 303. Specifically, it is preferred to select and use, for example, ultraviolet light at a wavelength of from 150 nm to 400 nm, X-rays, or an electron beam as appropriate.

Of these, the irradiation light 312 is particularly preferably ultraviolet light. This is because many of the compounds commercially available as curing aids (photopolymerization initiators) are compounds sensitive to ultraviolet light. Here, examples of light sources that emit ultraviolet light include high-pressure mercury lamps, ultrahigh-pressure mercury lamps, low-pressure mercury lamps, deep-UV lamps, carbon arc lamps, chemical lamps, metal halide lamps, xenon lamps, KrF excimer lasers, ArF excimer lasers, and $F_2$ excimer lasers. Ultrahigh-pressure mercury lamps are particularly preferred. In addition, one or more light sources may be used. In addition, light irradiation may be performed over the entire region of the curable composition (A) filling the fine pattern of the mold or may be performed only in a certain region thereof.

In addition, light irradiation may be performed intermittently multiple times over the entire region of the substrate or may be performed continuously over the entire region thereof. Furthermore, a certain region A may be irradiated in a first irradiation step, and a region B different from the region A may be irradiated in a second irradiation step.

<Release Step [5]>

Figure 3E:
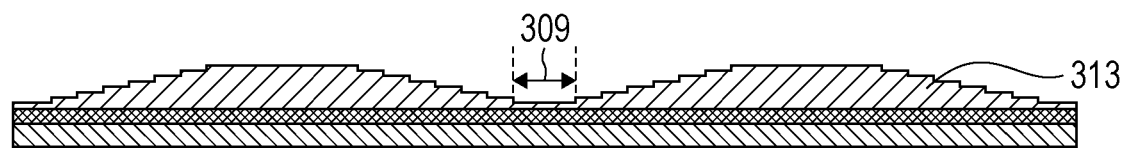
FIG. 3E is a schematic sectional view illustrating the photo-nanoimprint technique according to the present embodiment.

Next, the cured film 313 having a pattern shape is released from the mold 305. In this step (release step), as shown in FIG. 3E, the cured film 313 having a pattern shape is released from the mold 305 to obtain a self-standing cured film 313 having a pattern shape that is the inverted pattern of the fine pattern formed in the mold 305 in the step [4] (light irradiation step). Some cured film remains in the recesses of the uneven pattern of the cured film 313 having a pattern shape; this film is referred to as "remaining film".

There is no particular limitation as to the method for releasing the cured film 313 having a pattern shape from the mold 305 as long as no portion of the cured film 313 having a pattern shape is physically damaged upon release, and there is also no particular limitation as to, for example, the various conditions thereof. For example, the substrate 301 (substrate to be processed) may be fixed, and the mold 305 may be moved farther away from the substrate 301 and thereby stripped therefrom. Alternatively, the mold 305 may be fixed, and the substrate 301 may be moved farther away from the mold and thereby stripped therefrom. Alternatively, both of them may be pulled in exactly opposite directions and thereby stripped from each other.

By the above series of steps (manufacturing process) including the steps [1] to [5], a cured film having the desired stair pattern (a pattern shape derived from the stair pattern of the mold 305) at the desired position can be obtained.

In addition, using the cured film 313 obtained through the steps [1] to [5] and having a stair pattern as a mask, the substrate to be processed, or the layer to be processed on the substrate to be processed, can be processed into a stair pattern by processing means such as etching. Alternatively, after the layer to be processed is further deposited on the cured film 313 having a stair pattern, pattern transfer may be performed by processing means such as etching. In this way, a stair structure based on the pattern shape of the cured film 313 having a stair pattern can be formed on the substrate 301. Thus, for example, a stair structure required for 3D NAND flash memory and other devices can be formed.

In addition, the use of the method of the present invention for manufacturing a cured product pattern is not limited to the formation of stair structures for 3D NAND flash memory. Rather, various substrates can be processed.

The method of the present invention for manufacturing a cured product pattern can be utilized in methods for manufacturing various semiconductor devices such as SRAM and DRAM and can also be used to fabricate nanoimprint mold replicas.

For example, a quartz mold replica can be fabricated in a simple manner by forming a cured product pattern of the present invention on a quartz substrate and processing the surface of the quartz substrate based on that pattern, for example, by etching.

EXAMPLES

The present invention will now be described in more detail with reference to the following examples, although the technical scope of the present invention is not limited to the examples described below. All "parts" and "%" as used below are by weight unless otherwise specified.

<Mold>

In this example and the comparative examples, quartz imprint molds having recesses as shown in FIGS. 3C and 3D are used.

The size of the stair portions forming the sidewall surfaces of the recesses of the molds is as follows: the tread size D is 500 nm, and the riser size H is 100 nm. The slope of the sidewall surfaces of the molds, that is, the stair angle ($\theta_S$), calculated as $\theta_S = \cot^{-1}(D/H)$ from the above values is 11.3°.

<Preparation of Curable Composition (A), Contact Angle Measurement, and Imprint Evaluation>

The curable compositions (A) of the example and comparative examples were adjusted by the following method and were each evaluated.

Comparative Example 1

(1) Preparation of Substrate

A silicon substrate was used as the substrate 301, and spin-on carbon (SOC) was formed as the underlayer 302 on the surface of the substrate.

An SOC precursor composition prepared by dissolving a naphthalene-based compound, serving as an active ingredient, in an organic solvent was applied to the silicon wafer by spin coating. The spin coating conditions were as follows: at 1,700 rpm for 25 seconds. Thereafter, the SOC precursor composition was heated on a hot plate to form an underlayer. The heating conditions were as follows: at about 300° C. for about 3 minutes. Thus, an underlayer having a thickness of 300 nm or less was formed. In addition, the carbon atom concentration was measured by energy-dispersive X-ray spectrometry (EDX) using a review SEM G5 manufactured by Applied Materials, Inc. The measurement conditions were as follows: the acceleration voltage was 15 kV, the measurement current was 500 pA, and the measurement time was 30 seconds. The carbon atom content was 80.0% by weight, with the total number of atoms in the composition after baking being 100%.

(2) Preparation of Curable Composition (A-1')

The components (a), (b), (c), and (d) shown below were mixed together, and the mixture was filtered through a 0.2 μm ultrahigh-molecular-weight polyethylene filter to prepare Curable Composition (A-1') of Comparative Example 1.

(2-1) Composition of Curable Composition (A-1')
Component (a): 94 parts by weight in total
Isobornyl acrylate (manufactured by Kyoeisha Chemical Co., Ltd., trade name: IB-XA): 9.0 parts by weight
Benzyl acrylate (manufactured by Osaka Organic Chemical Industry Ltd., trade name: V#160): 38 parts by weight
Neopentyl glycol diacrylate (manufactured by Kyoeisha Chemical Co., Ltd., trade name: NP-A): 47 parts by weight
Component (b): 3.0 parts by weight in total
Lucirin (registered trademark) TPO (manufactured by BASF): 3.0 parts by weight
Component (c): 0 parts by weight in total
The component (c) was not added.
Component (d): 0.50 parts by weight in total
N,N'-tetraethyl-4,4'-diaminobenzophenone (manufactured by Tokyo Chemical Industry Co., Ltd., abbreviated as EAB): 0.50 parts by weight
Component (e): 0 parts by weight in total
The component (e) was not added.

(3) Contact Angle Measurement

A Drop Master manufactured by Kyowa Interface Science, Inc. was used to measure the contact angle of Curable Composition (A-1') on the underlayer. A droplet (about 1 μL) of Curable Composition (A-1') was dispensed onto the substrate, and the contact angle of the droplet was measured by the θ/2 method about 10 seconds after dispensing. Dispensing and measurement were performed five times. The arithmetic mean of the measurements was calculated to be 4.9°.

(4) Imprint Evaluation

Imprint evaluation was performed based on the stair angle and the measured contact angle. In the imprint evaluation, the manner of contact with the mold and the filling performance of the curable composition (A) were evaluated.

(4-1) Evaluation of Manner of Contact with Mold

The portion of the mold with which the curable composition (A) first comes into contact can be examined from the top of the mold with a high-speed camera during imprinting with the mold. The criteria are as follows:

Good: The curable composition (A) first comes into contact with the flat portions 307 (recesses) of the mold shown in FIG. 3C.

Poor: The curable composition (A) first comes into contact with the stair portions 308 or remaining film portions 309 of the mold shown in FIG. 3C.

The curable composition (A-1') was evaluated as poor because the curable composition (A) first came into contact with the stair portions of the mold as shown in FIGS. 2A and 2B.

(4-2) Evaluation of Filling Performance

The criteria for evaluation of filling performance are as follows:

Good: The curable composition quickly fills the recesses without any gas remaining at the stair pattern portions.

Fair: Gas remains at the stair pattern portions, and it takes time for the gas to disappear.

Poor: The recesses are not filled.

The curable composition (A-1') was evaluated as fair because gas remained at the stair pattern portions and it took time for the gas to disappear.

Comparative Example 2

(1) Preparation of Substrate

The same substrate as in Comparative Example 1 was prepared.

(2) Preparation of Curable Composition (A-2')

Of the components for the preparation of the curable composition (A-1'), the component (c) differs as follows:

Component (c): 0.25 parts by weight in total
Pentadecaethylene glycol mono-1H,1H,2H,2H-perfluorooctyl ether $(F(CF_2)_6CH_2CH_2(OCH_2CH_2)_{15}OH)$ (manufactured by DIC Corporation, abbreviated as DEO-15): 0.25 parts by weight The other components (a), (b), (d), and (e) were the same as those of the curable composition (A-1') in Comparative Example 1.

(3) Contact Angle Measurement

The contact angle was measured and calculated as in Comparative Example 1. The contact angle was 7.8°.

(4) Imprint Evaluation

Imprint was performed and evaluated as in Comparative Example 1.

(4-1) Evaluation of Manner of Contact with Mold

The curable composition (A-2') was evaluated as in Comparative Example 1. The curable composition (A-2') was evaluated as poor.

(4-2) Evaluation of Filling Performance

The curable composition (A-2') was evaluated as in Comparative Example 1. The curable composition (A-2') was evaluated as fair.

Comparative Example 3

(1) Preparation of Substrate

A silicon substrate was used as the substrate 301, and a photo-nanoimprint adhesion layer composition (B) was applied as the underlayer 302 to the silicon wafer by spin coating. The photo-nanoimprint adhesion layer composition (B) was an adhesion layer composition disclosed in paragraph 0123 of Japanese Patent No. 6141500. The spin coating conditions were as follows: at 500 to 4,000 rpm for 30 seconds. Thereafter, the silicon wafer was heated on a hot plate to form an underlayer. The heating conditions were as follows: at about 160° C. for 2 minutes. Thus, an underlayer having a thickness of 3 nm or less was formed. In addition, the carbon atom concentration was measured as in Comparative Example 1. The carbon atom content was 65.7% by weight, with the total number of atoms in the composition after baking being 100% by weight.

(2) Preparation of Curable Composition (A-3')

Of the components for the preparation of the curable composition (A-1'), the component (c) differs as follows:

Component (c): 0.50 parts by weight in total

Pentadecaethylene glycol mono-1H,1H,2H,2H-perfluorooctyl ether $(F(CF_2)_6CH_2CH_2(OCH_2CH_2)_{15}OH)$ (manufactured by DIC Corporation, abbreviated as DEO-15): 0.50 parts by weight The other components (a), (b), (d), and (e) were the same as those of the curable composition (A-1') in Comparative Example 1.

(3) Contact Angle Measurement

The contact angle was measured and calculated as in Comparative Example 1. The contact angle was 7.8°.

(4) Imprint Evaluation

Imprint was performed and evaluated as in Comparative Example 1.

(4-1) Evaluation of Manner of Contact with Mold

The curable composition (A-3') was evaluated as in Comparative Example 1. The curable composition (A-3') was evaluated as poor.

(4-2) Evaluation of Filling Performance

The curable composition (A-3') was evaluated as in Comparative Example 1. The curable composition (A-3') was evaluated as fair.

Example 1

(1) Preparation of Substrate

The same substrate as in Comparative Example 1 was prepared.

(2) Preparation of Curable Composition (A-1)

Of the components for the preparation of the curable composition (A-1') in Comparative Example 1, the component (c) differs as follows:

Component (c): 0.50 parts by weight in total

Pentadecaethylene glycol mono-1H,1H,2H,2H-perfluorooctyl ether $(F(CF_2)_6CH_2CH_2(OCH_2CH_2)_{15}OH)$ (manufactured by DIC Corporation, abbreviated as DEO-15): 0.50 parts by weight The other components (a), (b), (d), and (e) were the same as those of the curable composition (A-1') in Comparative Example 1.

(3) Contact Angle Measurement

The contact angle was measured and calculated as in Comparative Example 1. The contact angle was 12.2°.

(4) Imprint Evaluation

Imprint was performed and evaluated as in Comparative Example 1.

(4-1) Evaluation of Manner of Contact with Mold

The curable composition (A-1) was evaluated as in Comparative Example 1. The curable composition (A-1) was evaluated as good.

(4-2) Evaluation of Filling Performance

The curable composition (A-1) was evaluated as in Comparative Example 1. The curable composition (A-1) was evaluated as good.

Example 2

(1) Preparation of Substrate

The same substrate as in Comparative Example 1 was prepared.

(2) Preparation of Curable Composition (A-2)

Of the components for the preparation of the curable composition (A-1') in Comparative Example 1, the component (c) differs as follows:

Component (c): 1.0 part by weight in total

Pentadecaethylene glycol mono-1H,1H,2H,2H-perfluorooctyl ether $(F(CF_2)_6CH_2CH_2(OCH_2CH_2)_{15}OH)$ (manufactured by DIC Corporation, abbreviated as DEO-15): 1.0 part by weight The other components (a), (b), (d), and (e) were the same as those of the curable composition (A-1') in Comparative Example 1.

(3) Contact Angle Measurement

The contact angle was measured and calculated as in Comparative Example 1. The contact angle was 16.6°.

(4) Imprint Evaluation

Imprint was performed and evaluated as in Comparative Example 1.

(4-1) Evaluation of Manner of Contact with Mold

The curable composition (A-2) was evaluated as in Comparative Example 1. The curable composition (A-2) was evaluated as good.

(4-2) Evaluation of Filling Performance

The curable composition (A-2) was evaluated as in Comparative Example 1. The curable composition (A-2) was evaluated as good.

Example 3

(1) Preparation of Substrate

The same substrate as in Comparative Example 1 was prepared.

(2) Preparation of Curable Composition (A-3)

Of the components for the preparation of the curable composition (A-1'), the component (c) differs as follows:

Component (c): 2.0 parts by weight in total

Pentadecaethylene glycol mono-1H,1H,2H,2H-perfluorooctyl ether $(F(CF_2)_6CH_2CH_2(OCH_2CH_2)_{15}OH)$ (manufactured by DIC Corporation, abbreviated as DEO-15): 2.0 parts by weight The other components (a), (b), (d), and (e) were the same as those of the curable composition (A-1') in Comparative Example 1.

(3) Contact Angle Measurement

The contact angle was measured and calculated as in Comparative Example 1. The contact angle was 20.1°.

(4) Imprint Evaluation

Imprint was performed and evaluated as in Comparative Example 1.

(4-1) Evaluation of Manner of Contact with Mold

The curable composition (A-3) was evaluated as in Comparative Example 1. The curable composition (A-3) was evaluated as good.

(4-2) Evaluation of Filling Performance

The curable composition (A-3) was evaluated as in Comparative Example 1. The curable composition (A-3) was evaluated as good.

(List of Imprint Evaluation Results)

Table 1 below shows a list of imprint evaluation results for Comparative Examples 1 to 3 and Examples 1 to 3.

TABLE 1

| | Curable composition (A) | Underlayer | Carbon atom concentration (% by weight) | Contact angle $\theta_U$ on surface of substrate (°) | Stair angle $\theta_S$ of mold (°) | Contact with mold | Filling performance |
|---|---|---|---|---|---|---|---|
| Comparative Example 1 | (A-1') | SOC | 80.0 | 4.9 | 11.3 | Poor | Fair |
| Comparative Example 2 | (A-2') | | | 7.8 | | Poor | Fair |
| Comparative Example 3 | (A-3') | Curable composition (B) | 65.7 | 3.7 | | Poor | Fair |
| Example 1 | (A-1) | SOC | 80.0 | 12.2 | | Good | Good |
| Example 2 | (A-2) | | | 16.6 | | Good | Good |
| Example 3 | (A-3) | | | 20.1 | | Good | Good |

For Comparative Examples 1 to 3, the contact angle of the curable composition (A) on the surface of the substrate (the surface of the underlayer) is smaller than the stair angle of the mold. When the curable composition (A) comes into contact with the mold, it first comes into contact with the stair portions or remaining film portions of the mold, rather than the flat portions. As a result, gas tends to remain in the recesses of the mold, and it takes time to fill the recesses with the curable composition (A). In contrast, for Examples 1 to 3, the contact angle of the curable composition (A) on the underlayer is greater than the stair angle of the mold. When the curable composition (A) comes into contact with the mold, it can be first brought into contact with only the flat portions of the recesses. The curable composition (A) then spreads in the plane direction of the substrate due to contact with the bottom surfaces of the mold while forcing gas in the lateral direction of the stair pattern (in the direction toward the remaining film portions). Thus, the recesses are quickly filled with the curable composition (A).

The above results demonstrated that the use of the method of the present embodiment provides a photo-nanoimprint method using a mold having a stair pattern in which the stair pattern of the mold can be filled at high speed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for manufacturing a cured product pattern of a curable composition, comprising the steps of, in sequence:
   depositing a droplet of the curable composition onto a substrate;
   bringing a mold having an uneven pattern formed in a surface thereof into contact with the curable composition;
   curing the curable composition; and
   releasing a cured product of the curable composition from the mold,
      wherein the mold has a recess having a bottom surface and a stair structure arranged to form an opening that becomes wider from the bottom surface toward the surface of the mold,
      a contact angle of the curable composition on a surface of the substrate is greater than a stair angle of the stair structure and is less than 90°, and
      in the contact step, the curable composition comes into contact with the stair structure after a top of the droplet comes into contact with the bottom surface.

2. The method for manufacturing a cured product pattern according to claim 1, further comprising a step of forming an underlayer on the surface of the substrate.

3. The method for manufacturing a cured product pattern according to claim 2, wherein a contact angle $\theta_U$ of the curable composition (A) on the underlayer is greater than a stair angle $\theta_S$ of the stair structure and is less than 90°, where the stair angle $\theta_S$ is calculated as $\theta_S=\cot^{-1}(D/H)$ from a tread size D and a riser size H of the stair structure.

4. The method for manufacturing a cured product pattern according to claim 2, wherein a contact angle $\theta_M$ of the curable composition (A) on the mold is smaller than a contact angle $\theta_U$ of the curable composition (A) on the underlayer.

5. The method for manufacturing a cured product pattern according to claim 2, wherein the underlayer has a carbon atom concentration of 80% to 95% by weight.

6. The method for manufacturing a cured product pattern according to claim 2, wherein the underlayer is formed by applying and baking a precursor composition containing a naphthalene-based compound and an organic solvent.

7. The method for manufacturing a cured product pattern according to claim 2, wherein the underlayer is baked at a temperature of 180° C. or higher.

8. The method for manufacturing a cured product pattern according to claim 1, wherein the bottom surface has an area of 0.25 mm² or more.

9. The method for manufacturing a cured product pattern according to claim 1, wherein a height (L) of the droplet is greater than a depth (M) of the recess from the surface of the mold to the bottom surface.

10. The method for manufacturing a cured product pattern according to claim 1, wherein, for one recess of the mold, one corresponding droplet is deposited onto the substrate.

11. The method for manufacturing a cured product pattern according to claim 1, wherein the bottom surface of the recess of the mold has a larger area than the droplet.

12. The method for manufacturing a cured product pattern according to claim 1, wherein the droplet is deposited onto the substrate by performing ejection once from liquid ejection means.

13. The method for manufacturing a cured product pattern according to claim 1, wherein the droplet is deposited onto the substrate as a single droplet by performing ejection twice or more from liquid ejection means such that droplets are stacked on top of each other.

14. The method for manufacturing a cured product pattern according to claim 1, wherein the curable composition (A) contains a fluorinated surfactant in a proportion of from 0.50% by weight to 2.0% by weight.

15. A method for manufacturing a processed substrate, comprising the method for manufacturing a cured product pattern according to claim 1.

16. A method for manufacturing a mold replica, comprising the method for manufacturing a cured product pattern according to claim 1.

17. A method for manufacturing a semiconductor device, comprising the method for manufacturing a cured product pattern according to claim 1.

* * * * *